United States Patent [19]

Kishi

[11] Patent Number: 4,480,335
[45] Date of Patent: Oct. 30, 1984

[54] NOISE REMOVING APPARATUS IN AN FM RECEIVER

[75] Inventor: Hiroyasu Kishi, Gunma, Japan

[73] Assignees: Sanyo Electric Company Ltd., Moriguchi; Tokyo Sanyo Electric Co., Gunma, both of Japan

[21] Appl. No.: 374,887

[22] Filed: May 4, 1982

[30] Foreign Application Priority Data

May 28, 1981 [JP] Japan ................................ 56-81651

[51] Int. Cl.³ ............................................. H04B 1/10
[52] U.S. Cl. ................................. 455/212; 455/219; 455/222; 455/225; 381/13
[58] Field of Search ............... 455/212, 218, 219, 220, 455/222, 225, 205; 381/13, 94

[56] References Cited

U.S. PATENT DOCUMENTS

| | | | |
|---|---|---|---|
| 3,673,499 | 6/1972 | Avins et al. | 455/205 |
| 4,066,845 | 1/1978 | Kishi | 455/212 |
| 4,191,850 | 3/1980 | Tanada | 381/13 |
| 4,245,348 | 1/1971 | Imazeki | 455/212 |
| 4,356,350 | 10/1982 | Ienaka | 381/13 |
| 4,356,568 | 10/1982 | Ogita et al. | 455/212 |

FOREIGN PATENT DOCUMENTS 55-50746  4/1980  Japan .................................. 455/212

Primary Examiner—Jin F. Ng
Attorney, Agent, or Firm—Darby & Darby

[57] ABSTRACT

A noise removing apparatus in an FM receiver includes a high-pass filter (29) receiving an output from an FM detector circuit (11), a gate (15) being interrupted in response to a pulsive noise detected by level-discriminating an output from a variable gain amplifier (35) receiving an output from the high-pass filter (29). Transistors are provided for controlling the gain of the variable gain amplifier (35) according to the magnitude of a terminal voltage of a capacitor which is charged according to an output from a rectifying circuit (43). The noise removing apparatus further includes a voltage generator (51) for generating a voltage proportional to a received electric field strength and a circuit (53) for varying an amount to be charged in the capacitor according to the magnitude of a voltage from the voltage generator (51) for maintaining the gain of the variable gain amplifier (35) large at the time of strong electric field, so that a multipath noise can be effectively removed.

10 Claims, 11 Drawing Figures

NOISE REMOVING APPARATUS IN AN FM RECEIVER

BACKGROUND OF THE INVENTION

1. Field of the Invention

The present invention generally relates to a noise removing apparatus in an FM receiver. More particularly, the present invention relates to an improved noise removing apparatus for removing a multipath noise utilizing a prior pulsive noise removing circuit.

2. Description of the Prior Art

FIG. 1 is a block diagram showing an example of a prior art noise removing apparatus in an FM receiver where the present invention can be advantageously employed. The example as shown in FIG. 1 shows an FM stereo receiver. The FM stereo receiver comprises an antenna 1 for receiving a broadcast FM signal wave, a high frequency amplifier 3 for amplifying the FM signal received by the antenna 1, a local oscillator 7 for generating a local oscillation signal for the purpose of frequency conversion, a mixer 5 for mixing the amplified FM signal from the high frequency amplifier 3 with the local oscillation signal for converting the frequency of the FM signal into an intermediate frequency, an intermediate frequency amplifier 9 for amplifying the intermediate frequency signal from the mixer 5 and an FM detector 11 for demodulating the intermediate frequency signal into the original low frequency signal. The low frequency signal from the FM detector 11 is applied to a stereo multiplex circuit 19 through a delay circuit 13, a gate 15 and a store/pilot signal generating circuit 17. The stereo multiplex circuit 19 demodulates the provided low frequency signal into the original stereo signal. The left and right low frequency signals from the stereo multiplex circuit 19 are applied to left and right loud speakers 25 and 27, respectively, through a left low frequency amplifier 21 and a right low frequency amplifier 23. Detailed structure and operation of the respective blocks are well known to those skilled in the art. Hence, it is not believed necessary to describe the same here in more detail.

Circuits 13, 15 and 17 are interposed between the FM detector 11 and the stereo multiplex circuit 19 for removing a noise. The delay circuit 13 delays, say for 3 to 5 microseconds the low frequency signal from the FM detector 11 to provide the delayed signal to the gate 15. The gate 15 is interrupted when a pulsive noise is detected by a pulsive noise detecting circuit 31 as described subsequently and prevents the pulsive noise from being transmitted to the subsequent stage. The store/pilot signal generating circuit 17 is of a circuit for preventing a stereo pilot signal from being disturbed by opening or closing the gate 15. Such store/pilot signal generating circuit is typically seen in U.S. Pat. No. 4,066,845, issued Jan. 3, 1978 to the same assignee as the present invention and U.S. Pat. No. 3,739,285, issued June 12, 1973.

The low frequency signal from the FM detector 11 is also applied to a high-pass filter 29. The high-pass filter 29 is designed to detect the energy of a noise component included in the output of the FM detector 11 and is adapted to pass the signal component of the frequency (however, the frequency must be higher than an SCA band, in case of an SCA broadcast) higher than the stereo composite signal. The pulsive noise detector circuit 31 is aimed to detect a pulsive noise in the output of the high-pass filter 29 and is adapted to trigger a monostable multivibrator 33 upon detection of such pulsive noise. The monostable multivibrator 33 continues to provide an output for a predetermined time period after the same is triggered, so that the gate 15 is interrupted when the output is obtained from the monostable multivibrator 33. Thus, the pulsive noise can be prevented from being sounded from the loud speakers 25 and 27.

Such pulsive noise removing apparatus is known in U.S. Pat. No. 4,278,901, issued July 14, 1981, U.S. Pat. No. 4,289,981, issued Sept. 15, 1981 and the like and thus it is not believed necessary to describe the same here in more detail. The above described U.S. Pat. Nos. 4,278,901 and 4,289,981 both are assigned to the same assignee as the present invention.

A prior art noise removing apparatus as shown in FIG. 1 improves various points and, particularly, brings about an excellent meritorious effect as far as the removal of a pulsive noise is concerned. However, no multipath noise can be considered in any of prior art apparatuses. The multipath noise means a noise caused by a phase difference between received signals including a reflective signal wave as well as a direct signal wave which are received by a receiver. In particular in an FM stereo receiver, a stereo pilot signal having a frequency of 19 kHz mainly generates a large noise component, as shown in FIG. 2, due to an adverse effect of the multipath. The noise caused from the pilot signal basically comprises a repetition of 19 kHz and generates an audible noise from a loud speaker when the noise is demodulated. Such multipath noise is frequently generated in case where a receiving point where an FM signal is received by an FM receiver is continuously changed, for example, in case where the FM receiver is loaded in a car, and thus such multipath noise must be fully considered in a so-called car stereo.

SUMMARY OF THE INVENTION

Accordingly, a principal object of the present invention is to provide a noise removing apparatus being capable of effectively removing a multipath noise in an FM receiver.

An aspect of the present invention resides in a noise removing apparatus for removing a multipath noise utilizing a prior pulsive noise removing circuit.

Briefly described, the present invention comprises a noise removing apparatus in an FM receiver including a gate being interrupted in response to the detection of a pulsive noise, wherein the gate is closed in response to a multipath noise at the time of a strong electric field when a received electric field strength is higher than a predetermined strength.

In a preferred embodiment of the present invention, a pulsive noise detecting circuit including a high-pass filter and a variable gain amplifier for amplifying an output of the high-pass filter, receives an output from an FM detector circuit and level-discriminates an output of the variable gain amplifier with a predetermined threshold value to detect as a noise a component over the threshold value. The variable gain amplifier is adapted such that the gain thereof is controlled in an automatic gain control manner, so that the threshold value is relatively changed. In the preferred embodiment, a gain variation effect of the variable gain amplifier by way of the automatic gain control is reduced or mostly cancelled when an electric field strength exceeds a predetermined value. As a result, the situation caused in a prior pulsive noise removing apparatus can be prevented wherein a threshold value is made relatively high by making a gain control and thus a multipath noise could not be effectively detected. In such a way, in the preferred embodiment of the present invention, a multipath noise which gives more offense to the ear at the time of a strong electric field can be effectively removed, since an automatic gain control for controlling the gain of the variable gain amplifier is adapted to be controlled according to an electric field strength.

In a further preferred embodiment of the present invention, an automatic gain control circuit comprises a capacitor to which a charging current is applied proportional to the magnitude of a white noise, that is, a continuous noise. The variable gain amplifier is adapted such that the gain thereof is controlled according to a terminal voltage of the capacitor. At the time of strong electric field, the charging current to the capacitor is forcibly reduced, so that an automatic gain control effect is weakened or cancelled and eventually a multipath noise can be effectively detected.

An automatic gain control voltage for controlling the gain of the variable gain amplifier can be generated based on an output from a monostable multivibrator which provides pulses for opening and closing the gate. More particularly, in the embodiment in discussion, an automatic gain control voltage generator includes a capacitor which is charged while the output is obtained from the monostable multivibrator. The gain of the variable gain amplifier is controlled by a terminal voltage of the capacitor. The charging current to the capacitor is rendered small at the time of strong electric field so that the automatic gain control effect can be weakened in the same manner as the above described embodiment.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
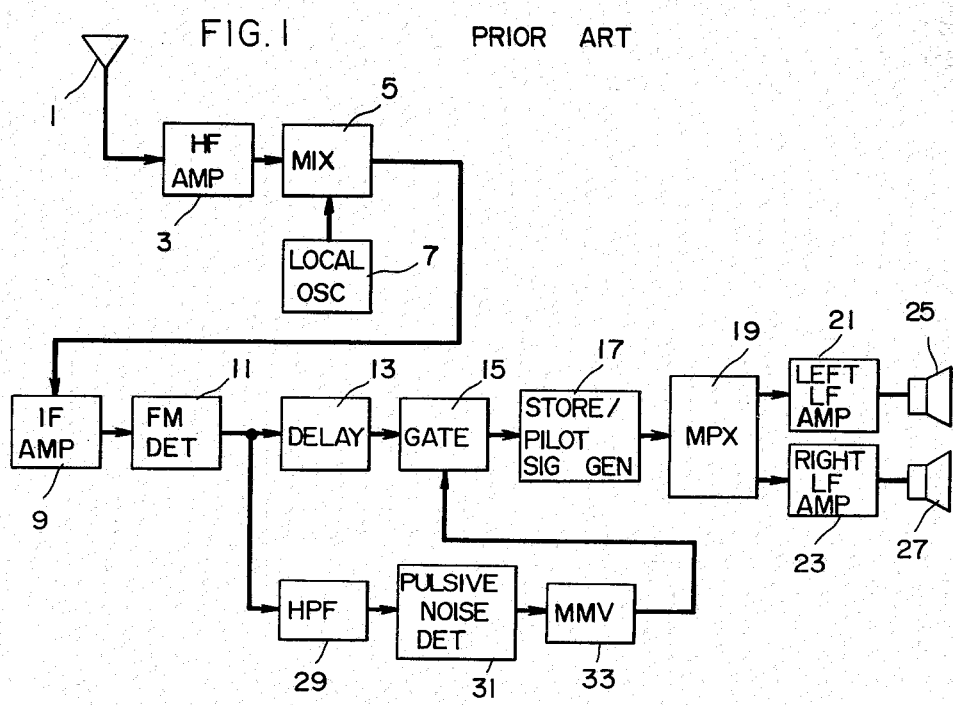
FIG. 1 is a block diagram showing one example of an FM stereo receiver employing a typical noise removing apparatus wherein the present invention can be advantageously employed.
Figure 3:
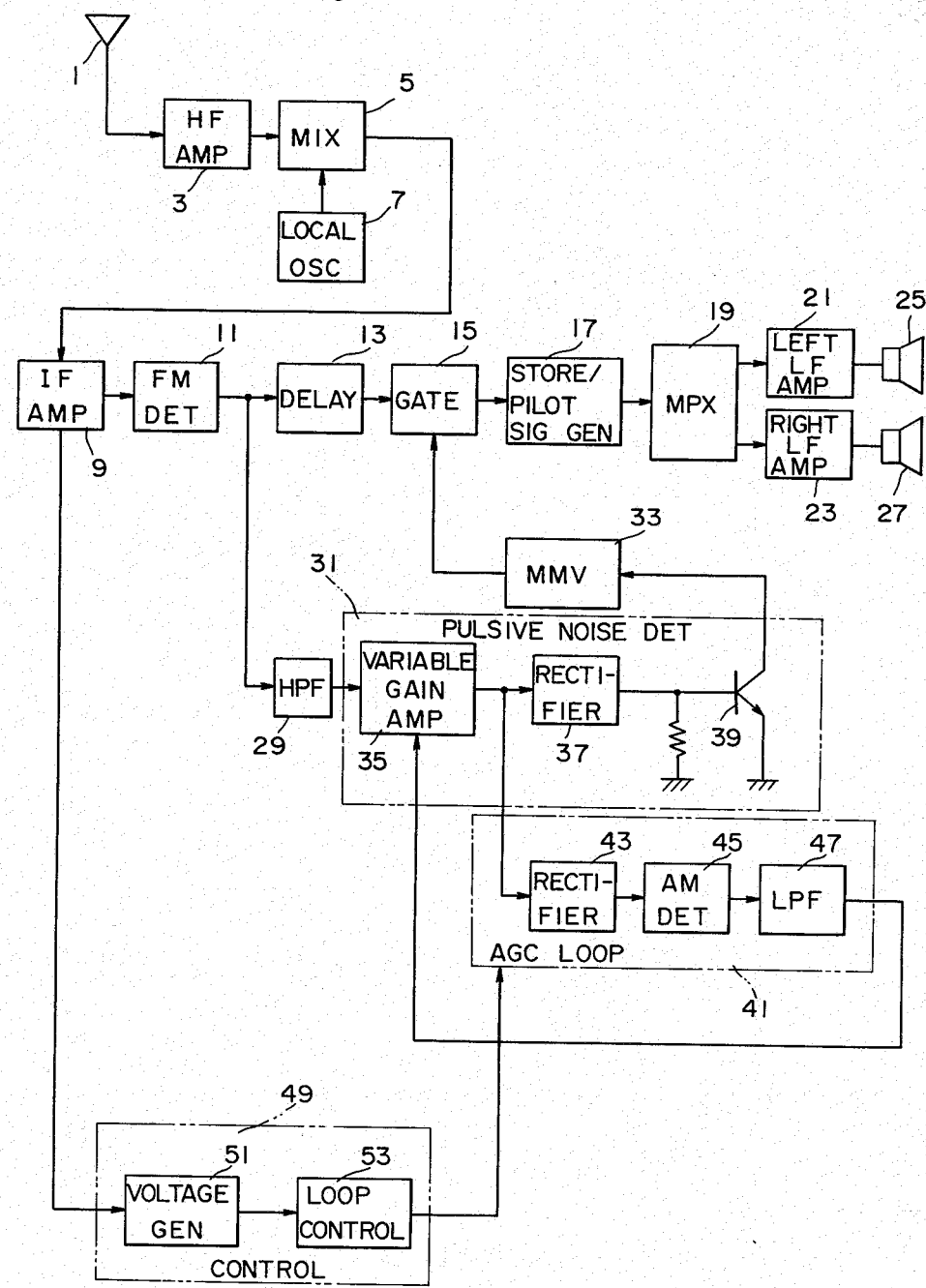
FIG. 3 is a block diagram showing one embodiment of the present invention.

FIG. 3 is a block diagram showing one embodiment of the present invention. The FIG. 3 embodiment is adapted to effectively remove a multipath noise utilizing a prior noise removing apparatus as shown in FIG. 1, and thus the respective components 1, 3, 5, 7, 9, 11, 13, 15, 17, 19, 21, 23, 25 and 27 shown therein are of the same structure and the same operation as those in FIG. 1. In addition, a high-pass filter 29, a pulsive noise detecting circuit 31 and a monostable multivibrator 33 are basically the same as those in FIG. 1 and thus it is not believed necessary to describe the same here in more detail.

A variable gain amplifier 35 included in the pulsive noise detecting circuit 31 amplifies a high frequency component passed by the high-pass filter 29 and applies the amplified output to two rectifying circuits 37 and 43. The rectifying circuits 37 and 43 comprises, for example, a full-wave rectifying circuit respectively, which full rectifies an output from the variable gain amplifier 35. The rectifying circuit 37 is included in the pulsive noise detecting circuit 31. The output from the rectifying circuit 37 is provided to a base input of a noise detecting transistor 39. The transistor 39 detects, as a noise, a component of the output from the rectifying circuit 37 when the output of the rectifying circuit 37 exceeds twice as much as the base-emitter voltage $V_{BE}$ of the transistor 39, that is, 2 $V_{BE}$. As described in the foregoing, the output of the noise detecting transistor 39 triggers the monostable multivibrator 33, so that the gate 15 is closed for a predetermined time period, for example, 50 microseconds.

Another rectifying circuit 43 is included in an automatic gain control loop 41 and the output thereof is applied to an amplitude detector 45. The amplitude detector 45 receives an output from the rectifying circuit 43 and detects the same in an envelope detection or peak detection manner. The detected output from the amplitude detector 45 is smoothed to a DC voltage by a low-pass filter 47, the smoothed output being applied as a gain control voltage of the above described variable gain amplifier 35.

A signal of an intermediate frequency amplifier 9 is applied to a control 49 for controlling the effect of an automatic gain control. The control 49 comprises a voltage generator 51. The voltage generator 51 outputs a voltage having a magnitude proportional to a received electric field strength, the voltage being applied to a loop control 53. The loop control 53 controls the automatic gain control loop 41 when the output voltage of the voltage generator 51 is large, that is, at the time of strong electric field, so that an automatic gain control effect at that time is adapted to be weakened or almost cancelled.

Figure 4:
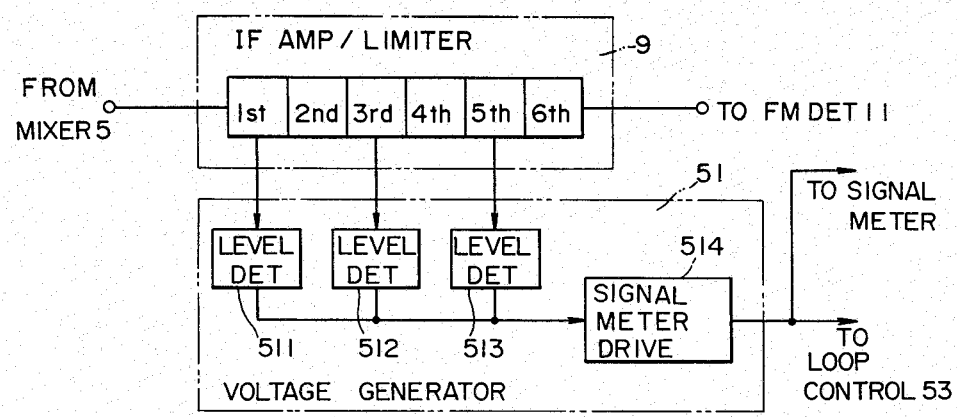
FIG. 4 is a block diagram showing a circuit for withdrawing a voltage corresponding to an electric field strength.
Figure 5:
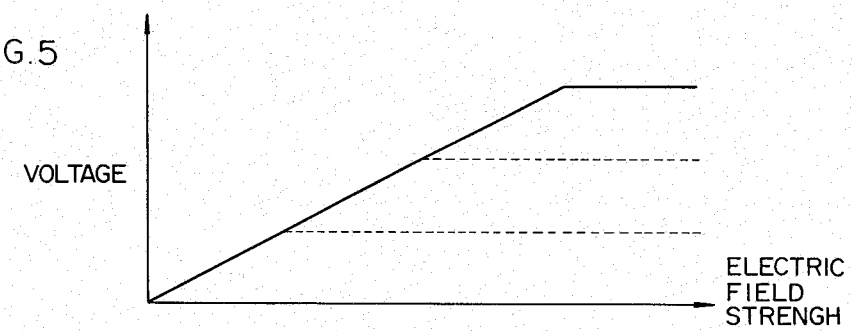
FIG. 5 is a graph showing a variation of a voltage to an electric field strength obtained in the FIG. 4 embodiment.

Now, referring to FIGS. 4 and 5, a circuit for outputting a voltage having a magnitude proportional to an electric field strength, that is, a voltage generator 5 will be described in detail. An intermediate frequency amplifier 9 includes six stages of amplifiers/limiters. Intermediate frequency signals from the first stage, the third stage and the fifth stage are applied to three level detectors 511, 512 and 513 included in the voltage generator 51. The respective outputs from three level detectors 511, 512 and 513 are applied to a signal meter drive circuit 514. The signal meter drive circuit 514 synthesizes the respective outputs from the level detectors 511, 512 and 513 to generate a signal meter drive voltage, as shown in FIG. 5, which varies in a linear manner in proportion to an electric field strength. The signal meter drive voltage is applied to a signal meter, not shown, so that a received electric field strength is indicated. The present embodiment employs a signal meter drive voltage in order to obtain a voltage having a magnitude proportional to an electric field strength. Accordingly, an output of the signal meter drive circuit 514 is applied to the loop control 53 included in the control 49. For example, as an intermediate frequency amplifier 9 and a voltage generator 51, a monolithic linear integrated circuit LA1230 manufactured by Tokyo Sanyo Electric Co., Ltd. can be utilized.

Then, an operation of the FIG. 3 embodiment will be briefly described. In case where a pulsive noise does not enter, the pulsive noise detecting circuit 31 provides no output and thus the monostable multivibrator 33 is not triggered. Therefore, the gate 15 is not interrupted. Accordingly, a low frequency signal from the FM detector 11 is applied to the stereo multiplex circuit 19 through the gate 15 and the store/pilot signal generating circuit 17. Thus, the low frequency signal is separated by the stereo multiplex circuit 19 into left and right stereo signals. At that time, only a continuous noise (a white noise) is caused on an output side of the high-pass filter 29.

If and when a pulsive noise enters the pulsive noise is applied to an input side of the variable gain amplifier 35 through the high-pass filter 29. Then, the pulsive noise is detected by the rectifying circuit 37 and the detecting transistor 39. If and when the output is obtained from the detecting transistor 39, the monostable multivibrator 33 is triggered and pulses are outputted from the monostable multivibrator 33 for a predetermined time period, say 50 microseconds. As a result, the gate 15 is interrupted while the pulses are outputted and the low frequency signal from the delay circuit 13 is not transmitted to the stereo multiplex circuit 19. Since the low frequency signal is delayed by the delay circuit 13 for a predetermined time period, that is, a time period during which the pulsive noise will reach the gate 15, eventually the pulsive noise included in the low frequency signal is interrupted and removed by the gate 15.

As described subsequently in detail, as an output from the high-pass filter 29, or a continuous noise becomes higher, an automatic gain control voltage corresponding to the magnitude thereof is generated by the automatic gain control loop 41 to control the gain of the variable gain amplifier 35. Accordingly, a threshold value for noise detection of the pulsive noise detecting transistor 39 is made relatively high so that the transistor 39 does not cause a malfunction due to increased white noise component. Thus, only a pulsive noise can be precisely detected irrespective of the increased continuous noise (a white noise). Such automatic gain control function is known in the previously cited two U.S. Pat. Nos. 4,278,901 and 4,289,981 and the like.

Figure 2:
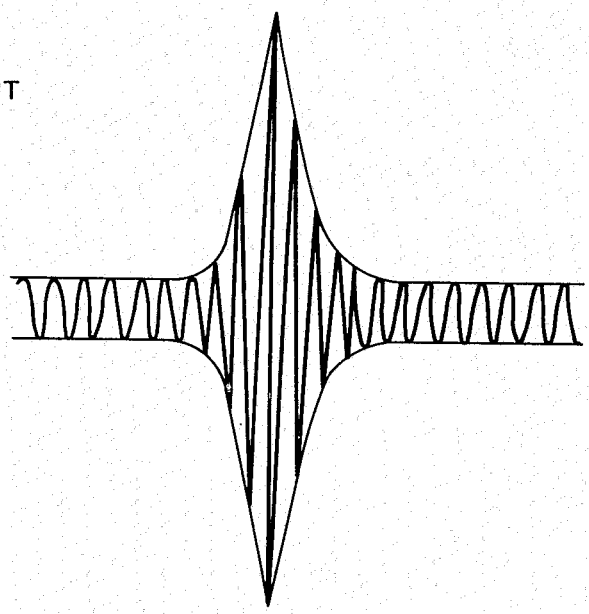
FIG. 2 is a view showing an example of a multipath noise wherein a noise is generated by a stereo/pilot signal having a frequency of 19 kHz.

On the other hand, a multipath noise as shown in FIG. 2 generates a rasping audible sound noise when the multipath noise is demodulated as a repetition noise of 19 kHz, as described in the foregoing. The present inventor discovered through various kinds of experiments that such multipath noise appeared more remarkably at the time of a strong electric field as compared with the time of weak electric field. More particularly, at the time of weak electric field, such multipath noise is not so rasping, since a continuous noise (a white noise) is relatively larger than the signal component and thus the signal to noise ratio is so small. However, at the time of strong electric field, a white noise is suppressed by a limiting action of a limiter and thus the signal to noise ratio becomes larger. If a multipath noise as shown in FIG. 2 is caused in such a state, such noise becomes very much rasping.

As described in the foregoing, the multipath noise is withdrawn to the output of the variable gain amplifier 35 as a kind of continuous noise mainly having a repetition of the frequency 19 kHz of a stereo pilot signal. Accordingly, the automatic gain control loop 41 generates a relatively large automatic gain control voltage such that the gain of the variable gain amplifier 35 is lowered. For this reason, the gain of the variable gain amplifier 35 is decreased and eventually the detecting transistor 39 hardly detects the above described multipath noise. As a result, the multipath noise passes through the gate 15 to reach the stereo multiplex circuit 19 and thus a rasping noise is generated from the loud speakers 25 and 27. With this point in mind, the inventor conceived the idea of controlling the automatic gain control loop 41 at the time of strong electric field when an electric field strength exceeds a predetermined value, so that the automatic gain control voltage from the loop 41 is made small and eventually an automatic gain control effect is reduced. Accordingly, if and when a multipath noise is generated at the time of strong electric field, the same is detected by the detecting transistor 39 and the gate 15 is interrupted. As a result, the multipath noise generated does not reach the stereo multiplex circuit 19. Thus, in the present embodiment, at the time of strong electric field, a detecting threshold value in the detecting transistor 39 is maintained a relatively small level by controlling the automatic gain control loop 41 through the control 49, so that the multipath noise can be effectively detected.

Figure 6:
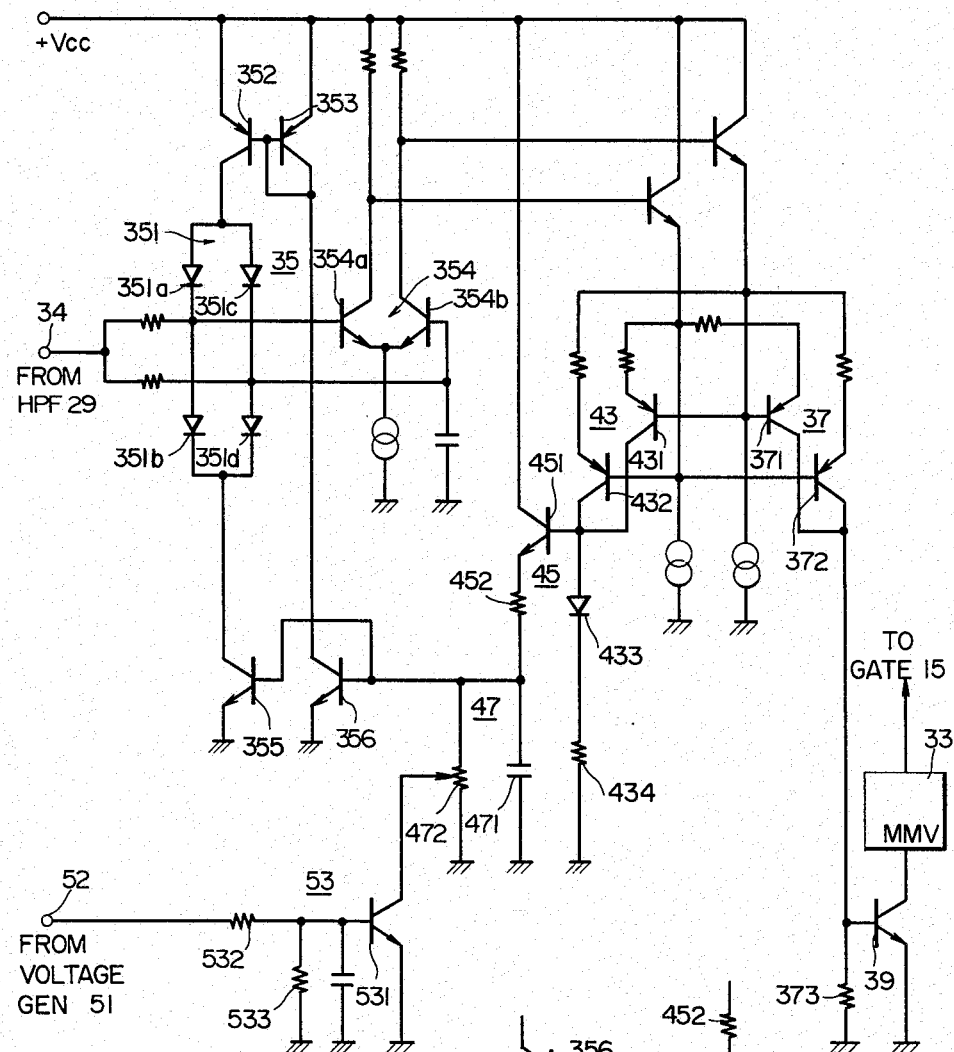
FIG. 6 is a circuit of an essential part showing a preferred embodiment in accordance with the FIG. 3 embodiment.

FIG. 6 is a circuit diagram of an essential part showing a preferred embodiment in accordance with the FIG. 3 embodiment. The output from the high-pass filter 29 is applied to the variable gain amplifier 35 through an input terminal 34. The variable gain amplifier 35 comprises a diode attenuation network 351 and a differential amplifier circuit 354. The diode attenuation network 351 is designed to attenuate a signal of a high frequency component applied from the input terminal 34 and comprises four diodes 351a through 351d. The diodes 351a and 351b are connected in series while the diodes 351c and 351d are connected in series, these two series connections of diodes being connected in parallel. One end of the diode attenuation network 351 is connected to a power source voltage +Vcc through a transistor 352 and the other end thereof is grounded through a transistor 355. The transistor 352 constitutes a current mirror circuit in cooperation with a transistor 353. The emitter electrode of the transistor 353 is connected to a voltage +Vcc and the collector of the transistor 353 is grounded through a transistor 356. The series junction of the diodes 351a and 351b and the series junction of the diodes 351c and 351d are connected, respectively, to the inputs of transistors 354a and 354b constituting a differential amplifier circuit 354. In the variable gain amplifier 35, an input signal is attenuated by the diode attenuation network 351 according to a voltage applied to the transistors 355 and 356 and the attenuated signal is applied to the differential amplifier circuit 354.

The respective outputs from the transistors 354a and 354b in the differential amplifier circuit 354 are applied to the full-rectifying circuits 37 and 43. The full-rectifying circuits 37 and 43 comprise a combination of two transistors 371 and 372 and a combination of two transistors 431 and 432, respectively. A load resistor 434 is connected to the output of the transistor 432 in the rectifying circuit 43. The output of the rectifying circuit 37 is applied to an input of the noise detecting transistor 39. The output of the rectifying circuit 43 is applied to an input of a detector transistor 451 constituting an amplitude detector 45. The detected output from the transistor 451 is applied to a low-pass filter 47 through a resistor 452. The low-pass filter 47 comprises a parallel connection of a capacitor 471 and a resistor 472, the terminal voltage of the capacitor 471 being applied as inputs of the gain control transistors 355 and 356 in the variable gain amplifier 35.

The above described structure in FIG. 6 is approximately the same as those disclosed in the above cited two U.S. Pat. Nos. 4,279,901 and 4,289,981. However, the resistor 472 of the low-pass filter 47 is provided as a variable resistor in the present embodiment.

The present embodiment characteristically comprises loop control 53. The loop control 53 comprises a transistor 531 having a collector connected to a slider of the variable resistor 472 in the low-pass filter 47 and an emitter connected to a ground. The voltage from the input terminal 52, that is, the voltage from the voltage generator 51 (FIGS. 4 and 5) is divided by the resistors 532 and 533 to be applied to the base input of the transistor 531. Accordingly, the transistor 531 is rendered conductive when the voltage proportional to the received electric field strength from the voltage generator circuit 51 exceeds the base-emitter voltage thereof.

Figure 7:
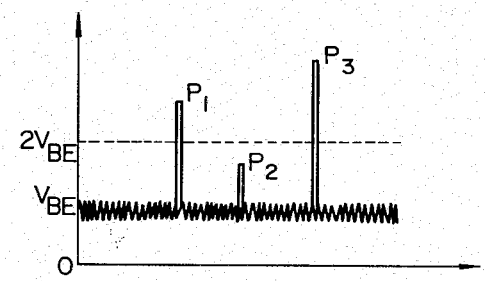
FIGS. 7 and 8 are waveforms for explaining an operation removing a pulsive noise in the FIG. 6 embodiment, respectively.
Figure 8:
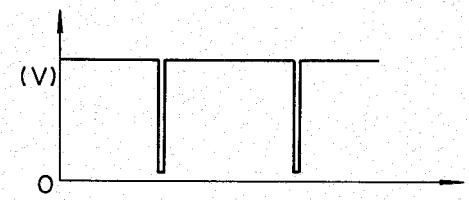

With the above described structure, the operation of the present embodiment will be explained with reference to FIGS. 7 and 8. In case where no pulsive noise exists, only a continuous noise (a white noise) is withdrawn from the high-pass filter 29 (FIG. 3). The continuous noise is amplified by the variable gain amplifier 35 and thereafter rectified by two full-rectifying circuits 37 an 43. The output of the rectifying circuit 43 is detected by the detecting transistor 451, the detected signal being smoothed by the low-pass filter 47. On the other hand, although the output of the rectifying circuit 37 is applied to the noise detecting transistor 39, the monostable multivibrator 33 is not triggered and thus the gate 15 (FIG. 3) is never interrupted since a pulsive noise is not included at that time.

The larger an output of the high-pass filter 29 or a continuous noise becomes, the larger the output of the detecting transistor 451 becomes, and thus a charging current flowing into a capacitor 471 is increased. If and when the terminal voltage of the capacitor 471 exceeds the respective base-emitter voltage $V_{BE}$ of the transistors 355 and 356, the transistors 355 and 356 are rendered conductive. Then, a current flowing into the diode attenuation network 351 increases and thus the impedance of the respective diodes 351a through 351d decreases, resulting in the decrease of the gain of the variable gain amplifier 35. Accordingly, irrespective of the magnitude of the continuous noise obtained on the output side of the high-pass filter 29, the respective output levels from the rectifying circuits 37 and 43 are approximately maintained constant. If and when the gain control transistors 355 and 356 are rendered conductive, the terminal voltage of the capacitor 471 is maintained to be the base-emitter voltage $V_{BE}$ of these transistors and thus the base voltage of the detecting transistor 451 is approximately 2 $V_{BE}$. Let it be assumed that the value of the resistance of the load resistor 434 is R1 and a current flowing thereto is I1, the base voltage $V_B1$ of the detecting transistor 451 is obtained from the following equation (1);

$$V_B1 = 2V_{BE} = V_{BE} + R1 \cdot I1 \ldots \quad (1)$$

From the equation (1), the current I1 is obtained from the following equation (2):

$$I1 = V_{BE}/R1 \ldots \quad (2)$$

If the base current of the detecting transistor 451 is neglected, the output current of the rectifying circuit 43 is equal to I1 in the equation (2). Accordingly, let it be assumed that the value of the resistance of the load resistor 373 is R2, the base voltage $V_B2$ of the detecting transistor 39 is obtained from the following equation (3):

$$V_B2 = R2 \cdot I1 = (R_2/R_1)V_{BE} \ldots \quad (3)$$

In the equation (3), if the condition of R1>R2 is set, the base voltage $V_B2$ of the detecting transistor 39 never exceeds the base-emitter voltage $V_{BE}$ and thus the detecting transistor 39 does not become conductive in case of only a continuous noise. Accordingly, a gate control signal is generated from the monostable multivibrator 33 and thus the gate 15 is maintained conductive and the output signal of the delay circuit 13 is transmitted through the gate 15 to the stereo multiplex circuit 19.

Next, the case where a pulsive noise enters will be explained. The pulsive noise is applied to the differential amplifier circuit 354 from the high-pass filter 29 through an input terminal 34. Hence, the pulsive noise is amplified by the amplifying circuit 354 and thereafter is rectified by two rectifying circuits 37 and 43. Although the detecting transistor 451 detects such pulsive noise, the terminal voltage of the capacitor 471 is not changed and the collector current of the transistors 355 and 356 is hardly changed since the duration of the pulsive noise is very short. For this reason, the amount of attenuation in the diode attenuation network 351 does not change and the gain of the variable gain amplifier 35 does not also change. As a result, the gain control of the amplifier circuit 35 is not made for the pulsive noise. On the other hand, a large amount of current flows into the load resistor 434 due to the output of the rectifying circuit 43 according to the pulsive noise and the base voltage $V_B1$ of the detecting transistor 451 become higher than 2 $V_{BE}$. At the same time, the output of other rectifying circuit 37 also increases and the terminal voltage of the load resistor 373 becomes higher than $V_{BE}$ and the detecting transistor 39 becomes conductive. More particularly, as shown in FIG. 7, pulsive noises P1 and P3 exceeding the detecting threshold value 2 $V_{BE}$ are detected and correspondingly the collector voltage of the detecting transistor 39 decreases as shown in FIG. 8. Therefore, the monostable multivibrator 33 is triggered to generate gate control pulses and the gate 15 is interrupted. Accordingly, the pulsive noise is never transmitted to the stereo multiplex circuit 19.

The operation of the FIG. 6 embodiment described in the foregoing is approximately the same as those in the above described cited two U.S. patents.

A prior art pulsive noise removing apparatus generally aims to remove an ignition noise of a car. A repetition frequency of the ignition noise is approximately 400 Hz which hardly affects the charging and discharging of the capacitor 471 in the low-pass filter 47. However, the above described multipath noise is of a noise of a repetition of 19 kHz which is a frequency of a pilot signal. Precisely speaking, there are relatively many noise of a repetition of 19 kHz, and thus other noise of other frequencies are mixed. The above described pulse noise having a repetition frequency 19 kHz gradually raises the terminal voltage of the capacitor 471 even if the duration is so short, since the pulse noise is repeated for the short time period. Eventually, the gain control transistors 355 and 356 become conductive. As a result, the gain of the variable gain amplifier 35 decreases, the outputs of the rectifying circuit 37 and 43 also decrease and thus the output of the rectifying circuit 37 does not reach the detecting level $2 V_{BE}$ of the detecting transistor 39. Thus, this is the reason why such multipath noise is generated as an audible noise from a loud speaker in a prior art circuit, since the multipath noise can not be detected by an automatic gain control effect. No prior art noise removing apparatuses consider removing of such multipath noise.

Then, in the present embodiment, a loop control 53 is provided for receiving a voltage proportional to a received electric field strength. More particularly, the inventor discovered that the multipath noise is remarkably generated at the time of a strong electric field and thus hit upon an idea of controlling of an automatic gain control effect according to a received electric field strength. As an embodiment thereof, one example as shown is adapted such that a signal meter drive voltage from an intermediate frequency amplifier 9 (FIG. 3) is withdrawn from the voltage generating circuit 51 (FIGS. 4 and 5) to be applied to the base of the transistor 531. As the voltage from the voltage generating circuit 51 becomes larger, or, as a received electric field strength becomes higher, the impedance between the collector and emitter of the transistor 531 decreases and eventually the value of resistance of the resistor 472 in the low-pass filter 47 is made smaller. Accordingly, an output current from the amplitude detector 45, that is, a charging current to the capacitor 471 is bypassed through a portion of the resistor 472 and the transistor 531. Hence, the terminal voltage of the capacitor 471 is never raised at the time of strong electric field and thus never renders the transistors 355 and 356 conductive. In other words, at the time of a strong electric field, a control voltage (automatic gain control voltage) to the variable gain amplifier 35 is maintained low, so that the gain of the variable gain amplifier 35 can not be decreased. Accordingly, if and when a multipath noise enters, the detecting transistor 39 becomes conductive, a gate control pulse is outputted from the monostable multivibrator 33, the gate 15 is interrupted and thus the multipath noise is prevented from being applied to the stereo multiplex circuit, in the same manner as the detection of the above described pulsive noise.

Figure 9:
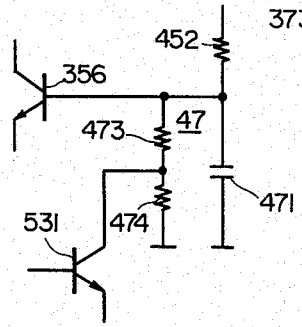
FIG. 9 is a circuit of an essential part showing a modification of the FIG. 6 embodiment.

Although the FIG. 6 embodiment constitutes the resistor 472 of the low-pass filter 47 as a variable resistor, a series connection of two resistors 473 and 474 may be used as shown in FIG. 9.

Meanwhile, a received electric field strength rendering the transistor 531 conductive can be arbitrarily set by varying the value of resistance of the resistors 532 and 533 in the loop control 53.

Although the above described embodiment is adapted to reduce the charging current of the capacitor 471 by substantially making small the resistor 472 included in the low-pass filter 47, other approaches for reducing the charging current may be used. One of such approaches is to vary the resistor 434 in the rectifying circuit 43 to make the rectifying gain small and the other is to make large the resistor 452 in the amplitude detector 45 to make the detecting gain small.

Figure 10:
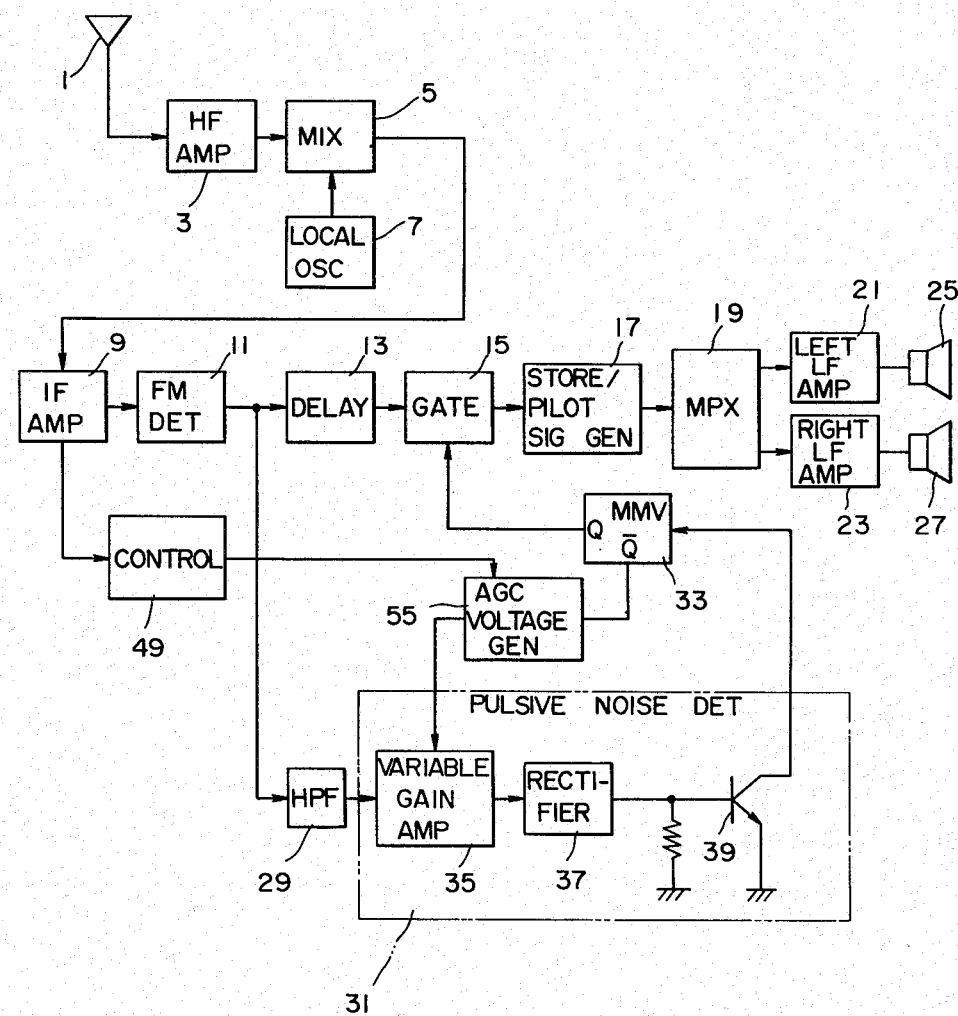
FIG. 10 is a block diagram showing another embodiment of the present invention.

FIG. 10 is a block diagram showing another embodiment of the present invention. The embodiment is the same as the previous FIG. 3 (FIG. 6) embodiment in that an automatic gain control effect is decreased or almost cancelled when a received electric field strength is large. Only an automatic gain control manner is different from the above described embodiment. More particularly, in the FIG. 10 embodiment, an automatic gain control voltage generator 55 is provided for generating an automatic gain control voltage utilizing an output of a monostable multivibrator 33. The automatic gain control voltage from the automatic gain control voltage generator 55 controls the gain of the variable gain amplifier 35 in the same manner as the above described embodiment. Then, a control 49 for controlling an automatic gain control effect is provided according to an electric field strength. The details in the control 49 are the same as those in FIGS. 3 and 6 described in the foregoing. In the present embodiment, at the time of a strong electric field, an automatic gain control effect to the variable gain amplifier 35 can be reduced or almost be cancelled, so that a multipath noise can be effectively removed.

Figure 11:
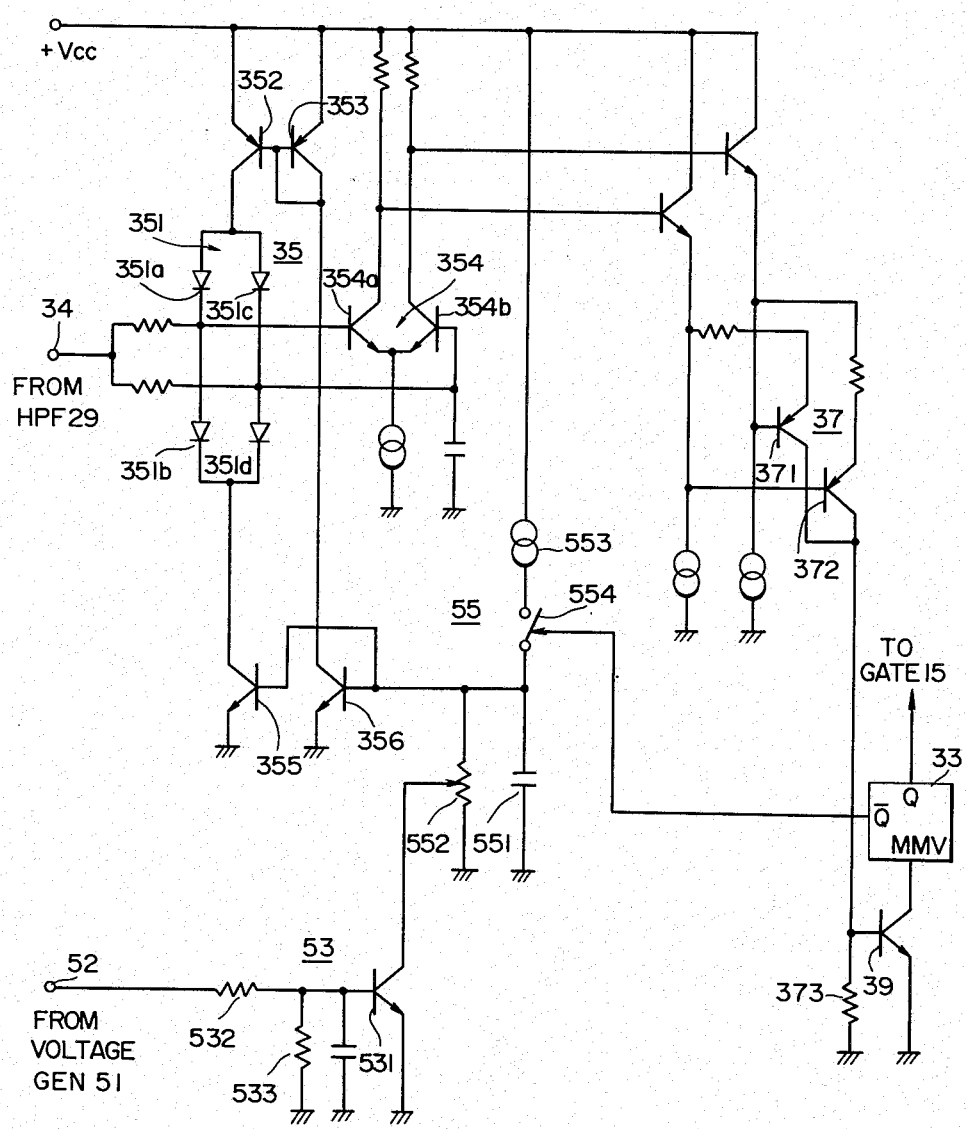
FIG. 11 is a circuit of an essential part showing a preferred embodiment in accordance with the FIG. 10 embodiment.

FIG. 11 is a circuit of an essential part showing a preferred embodiment in accordance with the FIG. 10 embodiment. The automatic gain control voltage generator 55 comprises a capacitor 551 and a resistor 552 connected in parallel to the capacitor 551. The capacitor 551 and the resistor 552 correspond to the capacitor 471 and the resistor 472, respectively. A charging current is applied to the capacitor 551 from a power supply voltage +Vcc, that is, a constant current source 553 through a switch 554. The switch 554 is closed according to the output Q from the monostable multivibrator 33. The monostable multivibrator 33 provides a gate control pulse for providing the gate 15 from the output Q thereof and a switch control pulse from the output Q̄.

The automatic gain control voltage generator 55 operates in the following manner. More particularly, a pulsive noise is detected by the detecting transistor 39 and the output Q is obtained as a high level and the output Q̄ is obtained as a low level from the monostable multivibrator 33, respectively. Therefore, the gate 15 is closed in the above described manner and thus the pulsive noise can be removed. On the other hand, the switch 554 is closed in response to the output Q̄ of the low level, and the charging current flows into the capacitor 551 from the constant current source 553 during the pulse period. Since the repetition frequency of a usual ignition noise is so long, the terminal voltage of the capacitor 551 does not reach the base-emitter voltage $V_{BE}$ of the transistors 355 and 356. If the repetition frequency of the pulsive noise becomes so fast, the current charged into the capacitor 551 is increased. Accordingly, in a usual case, that is, in the case where an electric field strength is not so strong, a signal to the stereo multiplex circuit 19 is prevented from being interrupted for a long period due to incoming pulsive noise. Without the control 49 or the loop control 53, the multipath noise is not detected and thus cannot be effectively removed. However, the present embodiment is adapted such that the detecting transistor 39 can effectively detect a multipath noise by reducing or almost cancelling the automatic gain control effect at the time of a strong electric field, in the same manner as described in the above described embodiment. Therefore, a rasping multipath noise can be removed, particularly, at the time of strong electric field.

All of the above described embodiments are adapted to reduce or almost cancel the automatic gain control effect to the variable gain amplifier 35 at the time of strong electric field. However, as a matter of course, such reducing or cancelling of the automatic gain control effect does not adversely affect a normal receiving state where no multipath noise exists. More particularly, an FM signal has a characteristic that a continuous noise (a white noise) is made extremely small as compared with a signal component at the time of a strong electric field and the signal to noise ratio is very excellent. In other words, since a continuous noise is so small at the time of strong electric field, it is not necessary to control the gain of the variable gain amplifier 35 to relatively raise the detecting threshold value of the detecting transistor 39. The automatic gain control function is provided so that if and when the continuous noise is increased, such increased continuous noise is not erroneously detected as a pulsive noise, and thus the automatic gain control hardly functions at the strong electric field when a continuous noise is so small. Accordingly, there is no problem even if an automatic gain control effect is reduced or almost cancelled at the time of strong electric field as disclosed in the embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A noise reducing apparatus in an FM receiver comprising:
   means for receiving a frequency modulated signal and generating an intermediate frequency signal therefrom;
   means coupled to said FM receiving means for FM detecting said intermediate signal and generating an output signal therefrom, said output signal including noise signals comprising pulsive noise and continuous noise resulting from multipath noise;
   output means for receiving said output signal;
   gate means coupled between said detecting means and said output means for interrupting the receipt of said output signal by said output means;
   pulsive noise detecting means coupled to said FM detecting means for detecting at least said pulsive noise, said pulsive noise detecting means comprising variable gain amplifier means for amplifying substantially only said noise signals and providing a signal representative thereof, and automatic gain control means adapted to receive said amplified noise signals for controlling the gain of said variable gain amplifier means in response to said continuous noise included in said noise signals so that at least said pulsive noise is detected;
   gate control means for opening said gate means in response to said amplified noise representative signal thereby interrupting receipt of said pulsive noise by said output means and removing at least said pulsive noise;
   electric field strength detecting means for detecting an electric field strength of said FM signal and for providing an output signal representative thereof; and
   automatic gain control effect controlling means responsive to said electric field strength detecting means output signal for controlling the gain control effect of said variable gain amplifier means resulting from said automatic gain control means, said multipath noise being detected by said pulsive noise detecting means when said electric field strength detecting means detects an electric field having a field strength greater than a predetermined value and said pulsive noise detecting means further provides an output signal for enabling said gate means to interupt the receipt of said multipath noise by said output means.

2. A noise removing apparatus in accordance with claim 1, wherein
   said automatic gain control means comprises automatic gain control voltage generating means (41) for generating an automatic gain control voltage corresponding to an amplitude of an output of said variable gain amplifying means (35), and
   said automatic gain control effect controlling means comprises automatic gain control voltage reducing means (53) for reducing an automatic gain control voltage generated from said automatic gain control voltage generating means (41) according to an output from the said electric field detecting means (9, 51).

3. A noise removing apparatus in accordance with claim 2, wherein
   said automatic gain control means comprises
   rectifying means (43) for rectifying an output from said variable gain amplifying means (35),
   amplitude detecting means (45) for amplitude detecting an output of said rectifying means (43), and
   a capacitor (471) being charged according to an output of said amplitude detecting means (45), a terminal voltage thereof being applied as a control voltage to said variable gain amplifying means (35), and
   said automatic gain control voltage reducing means comprises current reducing means (434, 452, 531) responsive to an output of said electric field strength detecting means (9, 51) for reducing a charging current flowing into said capacitor (471).

4. A noise removing apparatus in accordance with claim 3, wherein said current reducing means comprises means (434) for limiting a rectifying gain of said rectifying means (43).

5. A noise removing apparatus in accordance with claim 3, wherein said current reducing means comprises means (452) for limiting a detecting gain of said amplitude detecting means (45).

6. A noise removing apparatus in accordance with claim 1, wherein
   said gate control means comprises a monostable multivibrator (33), said automatic gain control means comprises automatic gain control voltage generating means (55) for generating an automatic gain control voltage corresponding to the duration time period of an output of said monostable multivibrator (33), said automatic gain control effect controlling means comprises automatic gain control voltage reducing means (53) for reducing an automatic gain control voltage generated from said automatic gain control voltage generating means (55) according to said electric field strength detecting means (9, 51).

7. A noise removing apparatus in accordance with claim 6, wherein said automatic gain control means comprises a capacitor (551) being charged during the duration time period of an output from said monostable multivibrator (33), the terminal voltage thereof being applied as a control voltage to said variable gain amplifying means (35), and said automatic gain control voltage reducing means comprises current reducing means (531) responsive to an output from said electric field strength detecting means (9, 51) for reducing a charging current flowing into said capacitor (551).

8. A noise removing apparatus in accordance with claim 2 or claim 7, which further comprises resistors (472, 552) connected in a parallel manner to said capacitors (471, 551), and wherein said automatic gain control voltage reducing means comprises means (531) substantially connected in parallel to said resistors (472, 552) and responsive to an output of said electric field strength detecting means (9, 51) for bypassing a current flowing into said resistors (472, 552).

9. A noise removing apparatus in accordance with any of claims 1, 2-5 wherein;

said receiving means comprises an intermediate frequency circuit including an amplifying means for amplifying said intermediate frequency signal and a limiter means for limiting an output amplitude from said amplifying means; and said electric field strength detecting means comprises means for generating a voltage proportional to said electric field strength of said FM signal corresponding to a magnitude of an output signal received from said intermediate signal amplifying means.

10. A noise reducing apparatus in an FM receiver comprising:

means for receiving a frequency modulated signal and generating an intermediate frequency signal therefrom;

means coupled to said FM receiving means for FM detecting said intermediate signal and generating an output signal therefrom said output signal including noise signals comprising pulsive noise and continuous noise resulting from multipath noise;

output means for receiving said output signal;

gate means coupled between said detecting means and said output means for interrupting the receipt of said output signal by said output means;

pulsive noise detecting means, coupled to said FM detecting means for detecting at least said pulsive noise, said pulsive noise detecting means comprising high pass filter means coupled to said detecting means for passing substantially only said noise signals to an output terminal thereof, variable gain amplifier means coupled to said high pass filter output terminal for amplifying said noise signals, noise signal detecting means for comparing said amplified noise signals to a predetermined level and providing a signal representative thereof, and automatic gain control means adapted to receive said amplified noise signals for controlling the gain of said variable gain amplifier means in response to said continuous noise included in said noise signals so that at least said pulsive noise is detected;

gate control means for opening said gate means in response to said representative compared signal for removing at least said pulsive noise;

electric field strength detecting means for detecting an electric field strength of said FM signal and for providing an output signal representative thereof;

automatic gain control effect controlling means responsive to said electric field strength detecting means output signal for controlling the gain control effect of said variable gain amplifier means resulting from said automatic gain control means, said multipath noise being detected by said pulsive noise detecting means when said electric field strength detecting means detects an electric field having a field strength greater than a predetermined value, said pulsive noise detecting means further providing an output signal for enabling said gate means to interrupt the receipt of said multipath noise by said output means.

* * * * *